(12) United States Patent
Vijayaraghavan et al.

(10) Patent No.: US 11,739,744 B2
(45) Date of Patent: Aug. 29, 2023

(54) FLUID MOVER AND METHOD OF OPERATING

(71) Applicant: GE Aviation Systems Limited, Cheltenham (GB)

(72) Inventors: Sanjay Vijayaraghavan, Bangalore (IN); Krishnendu Saha, Bangalore (IN); John Oliver Collins, Cheltenham (GB)

(73) Assignee: GE Aviation Systems Limited, Cheltenham (GB)

( * ) Notice: Subject to any disclaimer, the term of this patent is extended or adjusted under 35 U.S.C. 154(b) by 130 days.

(21) Appl. No.: 17/362,222

(22) Filed: Jun. 29, 2021

(65) Prior Publication Data

US 2022/0003227 A1 Jan. 6, 2022

(30) Foreign Application Priority Data

Jul. 3, 2020 (IN) .............................. 202011028450

(51) Int. Cl.
*F04B 37/00* (2006.01)
*H02K 44/02* (2006.01)
*H05K 7/20* (2006.01)
*F04B 45/047* (2006.01)

(52) U.S. Cl.
CPC ............. *F04B 37/00* (2013.01); *H02K 44/02* (2013.01); *H05K 7/20209* (2013.01); *H05K 7/20281* (2013.01); *F04B 45/047* (2013.01); *H05K 7/20172* (2013.01); *H05K 7/20272* (2013.01)

(58) Field of Classification Search
CPC .... F04B 37/00; H02K 44/02; H05K 7/20172; H05K 7/20209; H05K 7/20272; H05K 7/20281
USPC .......................................................... 417/48
See application file for complete search history.

(56) References Cited

U.S. PATENT DOCUMENTS

| | | | |
|---|---|---|---|
| 6,504,308 B1 | 1/2003 | Krichtafovitch et al. | |
| 8,226,047 B2 | 7/2012 | Gupta et al. | |
| 8,421,047 B2 | 4/2013 | Carmein et al. | |
| 8,502,181 B2 | 8/2013 | Carmein et al. | |
| 8,502,507 B1 | 8/2013 | White et al. | |
| 8,508,908 B2 * | 8/2013 | Jewell-Larsen | H05K 7/20172 361/231 |
| 8,878,150 B2 | 11/2014 | Carmein et al. | |
| 9,698,706 B2 | 7/2017 | White et al. | |
| 9,843,250 B2 * | 12/2017 | Tsoi | H02K 44/02 |
| 10,404,353 B2 | 9/2019 | Van Wynsberghe | |
| 2004/0155612 A1 | 8/2004 | Krichtafovitch | |
| 2011/0037325 A1 * | 2/2011 | Ciocanel | F04F 99/00 310/11 |
| 2011/0292593 A1 | 12/2011 | June et al. | |
| 2012/0000627 A1 | 1/2012 | Jewell-Larsen et al. | |

(Continued)

FOREIGN PATENT DOCUMENTS

CN 107846824 A 3/2018
EP 2540398 A1 1/2013

*Primary Examiner* — Charles G Freay
(74) *Attorney, Agent, or Firm* — McGarry Bair PC

(57) ABSTRACT

A fluid mover and method of operating includes a pair of spaced electrodes, a power supply electrically coupled to the pair of spaced electrodes, and at least one environment sensor. The fluid mover also includes a controller configured to controllably operate at least one of the power supply or the pair of spaced electrodes.

20 Claims, 6 Drawing Sheets

(56) References Cited

U.S. PATENT DOCUMENTS

2013/0048266 A1* 2/2013 Bauchot ............ G05D 23/1919
                                                            165/299
2016/0079840 A1   3/2016 Tsoi et al.

* cited by examiner

FLUID MOVER AND METHOD OF OPERATING

CROSS-REFERENCE TO RELATED APPLICATION(S)

This application claims priority to Indian Provisional Patent Application No. 202011028450, filed Jul. 3, 2020, which is incorporated by reference herein in its entirety.

TECHNICAL FIELD

The disclosure generally relates to fluid movers and methods of operating. More specifically, the disclosure relates to a fluid mover generating a fluid flow for cooling heat-generating components.

BACKGROUND

Electronic components are utilized in a wide variety of applications including for controlling operations of components or systems or for the supplying of heat, light, or power. For example, in an aircraft environment, electronic components or avionics can be utilized to control the various equipment and operations for flying the aircraft. The electronic components can be stored in a chassis, such as for protecting the avionics from environmental exposure. Electronic components can also generate heat during operation and cooling devices can be utilized for heat dissipation.

BRIEF DESCRIPTION

In one aspect, the disclosure relates to a fluid mover. The fluid mover includes a pair of spaced electrodes, a power supply electrically coupled to the pair of spaced electrodes, at least one environment sensor configured to provide a signal indicative of an environmental parameter, and a controller electrically coupled to the at least one environment sensor, the power supply, and the pair of spaced electrodes, with the controller configured to determine an operating parameter of the fluid mover based on the signal, and to controllably operate at least one of the power supply or at least one electrode in the pair of spaced electrodes based on the operating parameter.

In another aspect, the disclosure relates to a method of operating a fluid mover. The method includes sensing, via a sensor, at least one environmental parameter, and forming an operating voltage across the pair of spaced electrodes based on the at least one environmental parameter to cause a fluid flow between the pair of spaced electrodes.

DETAILED DESCRIPTION

Figure 1:
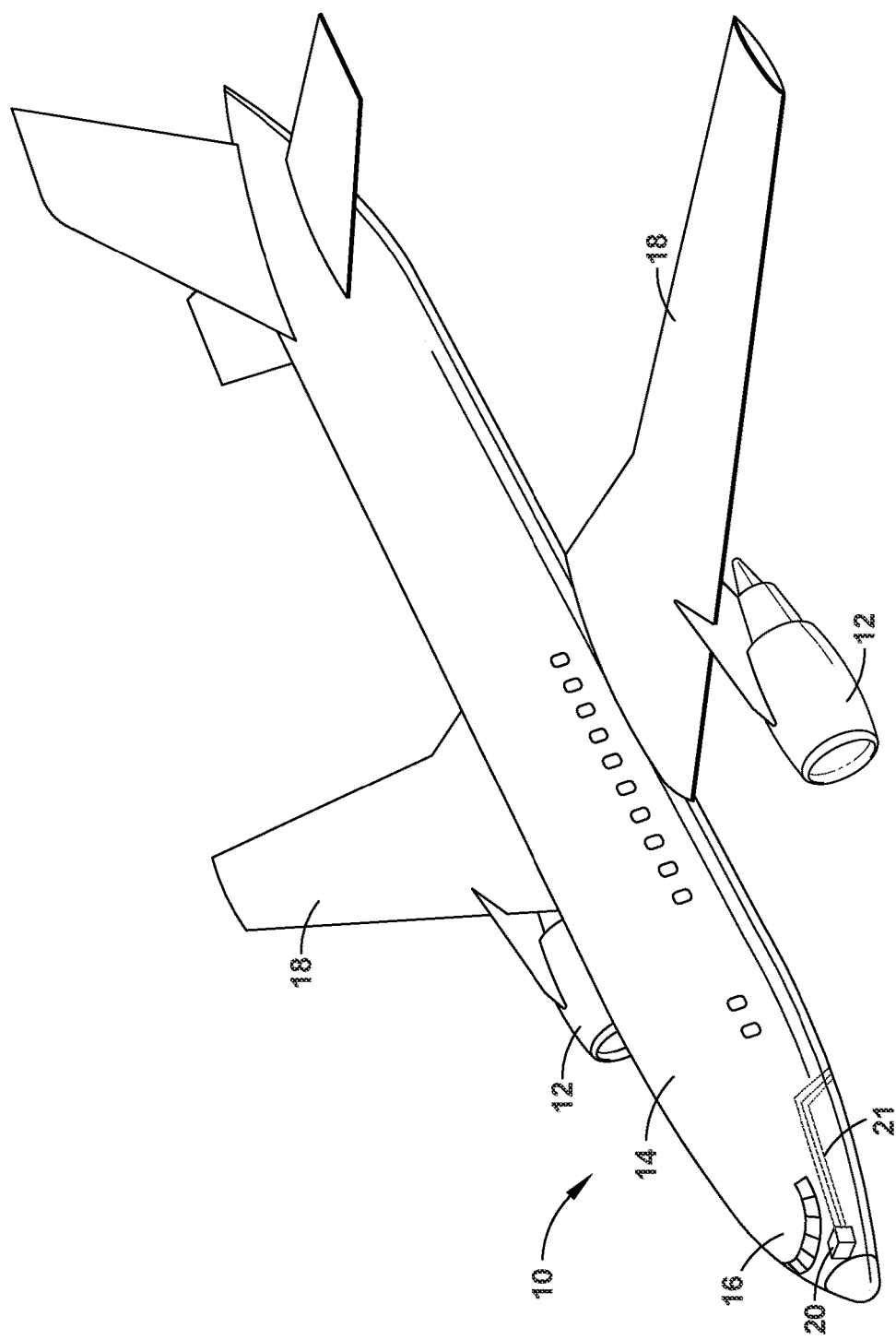
FIG. 1 is a perspective view of an aircraft having a chassis containing at least one heat-generating component.

Aspects of the present disclosure describe a fluid mover configured to provide cooling for heat-generating components. For the purposes of illustration, the fluid mover of the present disclosure will be described with respect to an air mover, such as an electrohydrodynamic (EHD) air mover, for cooling electronic components. For example, the fluid mover can be utilized in an exemplary aircraft environment for cooling avionics. It will be understood that the present disclosure is not so limited and can also have general applicability in non-aircraft environments, such as ground-based electrical systems or solar power distribution systems, and may also be used to provide benefits in industrial, commercial, and residential applications.

While aspects of the disclosure can have general applicability, the fluid mover will be described in an exemplary application of an avionics chassis. For example, aircraft and avionics can have high power demands or high power density, and more efficient electrical and thermal management can be desirable for such applications. In such an environment, the fluid mover described herein can lend itself to an increased avionics power density which allows for increased computational power, or increased sensor or emitter power, supported within a physically-constrained space, weight-constrained space, or volume-constrained space.

All directional references (e.g., radial, axial, proximal, distal, upper, lower, upward, downward, left, right, lateral, front, back, top, bottom, above, below, vertical, horizontal, clockwise, counterclockwise, upstream, downstream, forward, aft, etc.) are used only for identification purposes to aid the reader's understanding of the present disclosure, and should not be construed as limiting on an embodiment, particularly as to the position, orientation, or use of aspects of the disclosure described herein. Connection references (e.g., attached, coupled, fixed, connected, joined, and the like) are to be construed broadly and can include intermediate members between a collection of elements and relative movement between elements unless otherwise indicated. As such, connection references do not necessarily infer that two elements are directly connected and in fixed relation to one another. The singular forms "a", "an", and "the" include plural references unless the context clearly dictates otherwise. Furthermore, as used herein, the term "set" or a "set" of elements can be any number of elements, including only one.

Approximating language, as used herein throughout the specification and claims, is applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value, or the precision of the methods or machines for constructing or manufacturing the components and/or systems. For example, the approximating language may refer to being within a 10 percent margin.

The exemplary drawings are for purposes of illustration only and the dimensions, positions, order and relative sizes reflected in the drawings attached hereto can vary.

Additionally, as used herein, a "controller" or "controller module" can include a component configured or adapted to provide instruction, control, operation, or any form of communication for operable components to effect the operation thereof. A controller module can include any known processor, microcontroller, or logic device, including, but not limited to: field programmable gate arrays (FPGA), an application specific integrated circuit (ASIC), a full authority digital engine control (FADEC), a proportional controller (P), a proportional integral controller (PI), a proportional derivative controller (PD), a proportional integral derivative controller (PID controller), a hardware-accelerated logic controller (e.g. for encoding, decoding, transcoding, etc.), the like, or a combination thereof. Non-limiting examples of a controller module can be configured or adapted to run, operate, or otherwise execute program code to effect operational or functional outcomes, including carrying out various methods, functionality, processing tasks, calculations, comparisons, sensing or measuring of values, or the like, to enable or achieve the technical operations or operations described herein. The operation or functional outcomes can be based on one or more inputs, stored data values, sensed or measured values, true or false indications, or the like. While "program code" is described, non-limiting examples of operable or executable instruction sets can include routines, programs, objects, components, data structures, algorithms, etc., that have the technical effect of performing a particular tasks or implement particular abstract data types. In another non-limiting example, a controller module can also include a data storage component accessible by the processor, including memory, whether transient, volatile or non-transient, or non-volatile memory. Additional non-limiting examples of the memory can include Random Access Memory (RAM), Read-Only Memory (ROM), flash memory, or one or more different types of portable electronic memory, such as discs, DVDs, CD-ROMs, flash drives, universal serial bus (USB) drives, the like, or any suitable combination of these types of memory. In one example, the program code can be stored within the memory in a machine-readable format accessible by the processor. Additionally, the memory can store various data, data types, sensed or measured data values, inputs, generated or processed data, or the like, accessible by the processor in providing instruction, control, or operation to effect a functional or operable outcome, as described herein.

Additionally, as used herein, elements being "electrically connected," "electrically coupled," or "in signal communication" can include an electric transmission or signal being sent, received, or communicated to or from such connected or coupled elements. Furthermore, such electrical connections or couplings can include a wired or wireless connection, or a combination thereof.

Also, as used herein, while sensors can be described as "sensing" or "measuring" a respective value, sensing or measuring can include determining a value indicative of or related to the respective value, rather than directly sensing or measuring the value itself. The sensed or measured values can further be provided to additional components. For instance, the value can be provided to a controller module or processor as defined above, and the controller module or processor can perform processing on the value to determine a representative value or an electrical characteristic representative of said value.

Also as used herein, the term "satisfies" regarding a threshold value is used to mean that the respective value or values satisfy the predetermined threshold, such as being equal to or less than the threshold value, or being within the threshold value range. For example, if a sensed value falls below a threshold value, the sensed value can "satisfy" the threshold. Additionally, as used herein, the term "exceeds" regarding a threshold value is used to mean that the respective value does not satisfy the predetermined threshold, such as being outside of a threshold value range, falling above a maximum threshold, or falling below a minimum threshold. For example, if a sensed value falls below a minimum threshold, the value can "exceed" the threshold. It will be understood that such a determination may easily be altered to be satisfied by a positive/negative comparison, exceeding comparison, or a true/false comparison.

FIG. 1 schematically depicts an aircraft 10 that can include one or more propulsion engines 12 coupled to a fuselage 14, a cockpit 16 positioned in the fuselage 14, and wing assemblies 18 extending outward from the fuselage 14. While illustrated in a commercial airliner, aspects of the disclosure can be utilized in any type of aircraft, for example, without limitation, fixed-wing, rotating-wing, rocket, commercial aircraft, or personal aircraft. Furthermore, aspects of the disclosure are not limited only to aircraft aspects, and can be included in other mobile and stationary configurations. Non-limiting examples of such mobile configurations can include ground-based, water-based, or additional air-based vehicles.

The aircraft 10 can include an on-board chassis 20 (shown in phantom) for housing heat-generating components. In a non-limiting example, the chassis 20 can be in the form of an electronics chassis for housing heat-generating avionics or avionics components for use in the operation of the aircraft 10. The chassis 20 can include thermal management members including, but not limited to, heat spreaders, heat sinks, heat exchanger, radiators, or heat pipes. The chassis 20 can be configured to house a variety of electronic components or avionics elements and protect them against contaminants, electromagnetic interference (EMI), radio frequency interference (RFI), vibrations, and the like, or combinations thereof.

While illustrated proximate to the cockpit 16, it will be understood that the chassis 20 can be located anywhere within the aircraft 10. For example, the chassis 20 can be located in the cockpit 16, in a cabin of the aircraft 10, or in a storage bay within the aircraft 10, in further non-limiting examples.

Furthermore, the chassis 20 can be stored in any suitable environment within the aircraft 10, including in a pressurized or unpressurized environment within the aircraft 10. As used herein, a "pressurized environment" will refer to a first environment having a higher fluid pressure compared to a surrounding second environment. For example, a "pressurized environment" within the aircraft 10 can have a higher air pressure than the ambient air outside the aircraft, such as during flight including take-off, cruise, or landing. Another example of a "pressurized environment" within the aircraft 10 includes an air pressure within a housing being higher than an ambient air pressure surrounding the housing within the aircraft 10, such as a cabin pressure. Some non-limiting examples of a "pressurized environment" include a fluid pressure between 70 kPa and 85 kPa, or between 40 kPa and 70 kPa, or between 85 kPa and 120 kPa.

Additionally, as used herein, an "unpressurized environment" will refer to a first environment having the same fluid pressure as a surrounding second environment. In one example, an "unpressurized environment" within the aircraft 10 can have the same air pressure as the ambient air outside the aircraft, such as during take-off, cruise, or landing. Another example of an "unpressurized environment" within the aircraft 10 includes an air pressure within a housing being the same as an ambient air pressure surrounding the housing within the aircraft 10. Some non-limiting examples of an "unpressurized environment" include a fluid pressure between 15 kPa and 25 kPa, or between 5 kPa and 15 kPa.

Figure 2:
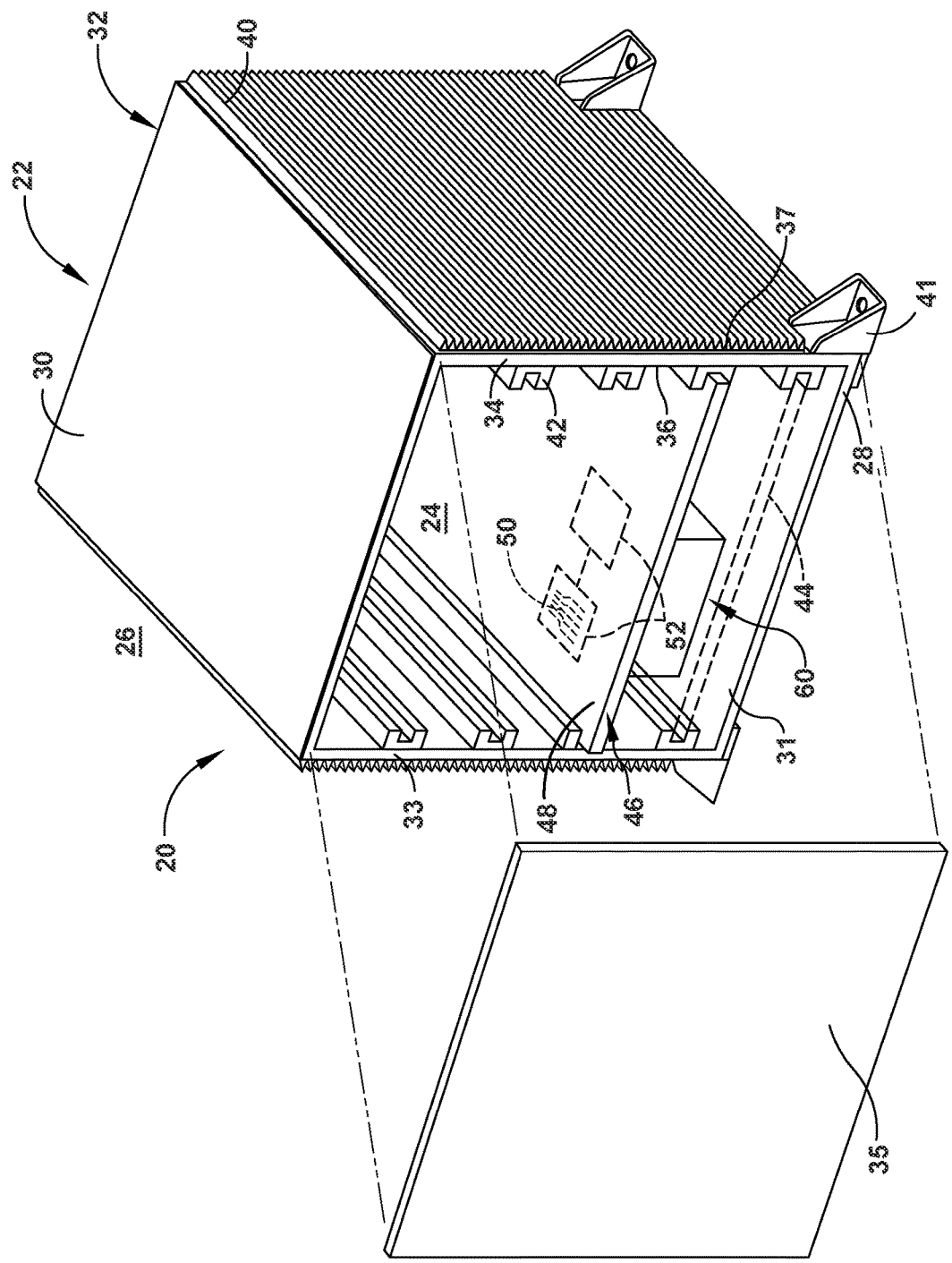
FIG. 2 is a perspective view of the chassis of FIG. 1 in the form of an electronics chassis with a fluid mover in accordance with various aspects described herein.

FIG. 2 illustrates the chassis 20 in further detail, where the chassis 20 can include a chassis housing 22 defining an interior 24 and exterior 26. The chassis 20 can include a chassis frame 28 having a top cover 30, a bottom wall 31, a back wall 32, and opposing sidewalls 33, 34. The chassis frame 28 can further include a removable front cover 35, providing access to the interior 24 of the chassis 20 when removed, and at least partially restricting access to the interior 24 when coupled or mounted to the chassis frame 28. In addition, the sidewalls 33, 34 can include an interior surface 36 and an exterior surface 37. The frame can be formed from any suitable material, such as aluminum or steel in non-limiting examples.

Further still, a set of fins 40 can project from the exterior surface 37 of the sidewalls 33, 34. The set of fins 40 can also be formed of any suitable material including aluminum or steel. While the set of fins 40 are shown on the sidewalls 33, 34, the set of fins 40 can be disposed on any exterior portion of the chassis 20, such as the top cover 30 or the bottom wall 31 in additional non-limiting examples. While the set of fins 40 are shown extending fully along the sidewalls 33, 34, it should be appreciated that the set of fins 40 need not extend the full length of the sidewalls 33, 34, and can be organized in other configurations.

Optionally, a set of mounting feet 41 can extend from the chassis housing 22 to facilitate mounting the chassis 20 to the aircraft 10 by means of bolts or other suitable fasteners. The set of mounting feet 41 can also function to electrically ground the chassis 20 to the frame of the aircraft 10. While the example of FIG. 2 illustrates the set of mounting feet 41, any desired type of attachment mechanism can be utilized to secure or ground the chassis 20 within the aircraft 10.

The chassis 20 can further include a set of card rails 42 within the interior 24 and supported by the interior surface 37 of the sidewalls 33, 34. The set of card rails 42 can be horizontally aligned on the interior surfaces 37 and spaced on opposing sidewalls 33, 34 to define effective card slots 44 (illustrated by the phantom lines). An avionics system 46 including at least one avionics system card 48 can be housed within the chassis 20 by way of the card slots 44, wherein each card slot 44 can be configured to receive at least a portion of an avionics system card 48. While only one avionics system card 48 is shown, the chassis 20 can be configured to house, support, or include any number of avionics system cards 48.

Each avionics system card 48 can include a set of wires 50. The set of wires 50 can be formed of any suitable material, including copper or aluminum. At least one heat-producing electronic component 52 can also be provided on the avionics system card 48. It should be understood that the set of wires 50 can be used within the electronic component 52, or to connect multiple electronic components 52, or anywhere else within or on the avionics system card 48 as desired.

The avionics system 46 can further include an exemplary fluid mover 60 for cooling a heat-generating component within the chassis 20, such as for cooling the heat-producing electronic component 52. The fluid mover 60 is illustrated as being provided within the chassis 20 and thermally coupled to the avionics system card 48 such that heat can move away from the electronic component 52 and out of the chassis 20, including via the set of fins 40. While the heat-producing electronic component 52 is illustrated externally of the fluid mover 60, it is further contemplated that the heat-producing electronic component 52 can be located within the fluid mover 60, such as within a housing of the fluid mover 60.

By way of non-limiting example, it is contemplated that air can be provided along the set of fins 40 to move the heat away. It is further contemplated that heat introduced to the exterior 26 of the chassis 20 can also dissipate by convection, including natural convection.

Figure 3:
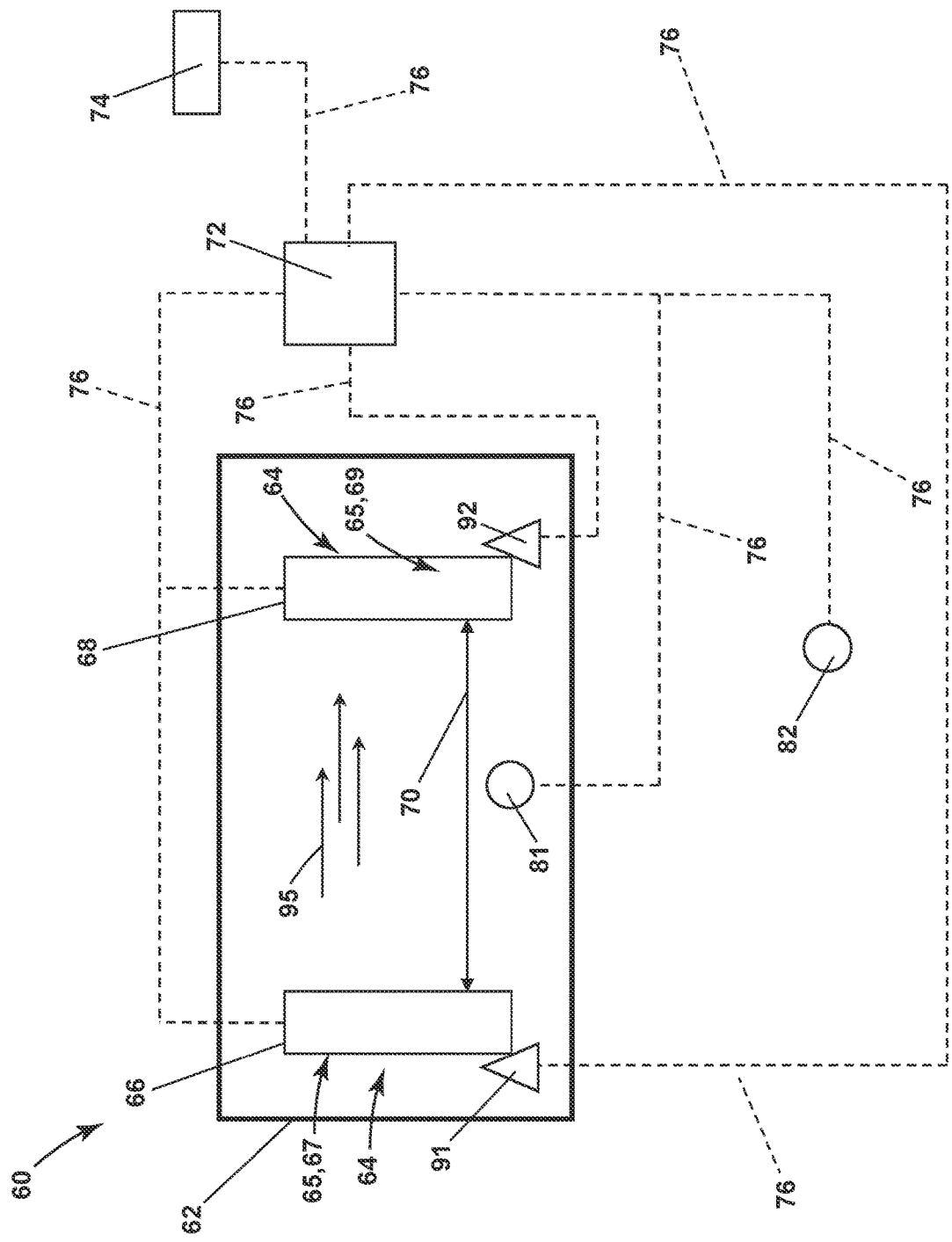
FIG. 3 is a schematic view of the fluid mover of FIG. 2.

Referring now to FIG. 3, the fluid mover 60 is schematically illustrated. The fluid mover 60 includes a housing 62 containing at least one pair of spaced electrodes 64. In the example shown, the pair of spaced electrodes 64 includes a first electrode 66, a second electrode 68, and a spacing distance 70 defined between the first and second electrodes 66, 68. Any suitable spacing distance 70 can be utilized, including between 0.5 cm and 3 cm, or between 3 cm and 10 cm, or greater than 10 cm, in non-limiting examples.

The pair of spaced electrodes 64 can form an anode-cathode pair. In this manner, either of the first or second electrode 66, 68 can form an anode (e.g. positively charged) or a cathode (e.g. negatively charged). For explanatory purposes, a remainder of this description will refer to the example shown as the first electrode 66 being in the form of a cathode and the second electrode 68 being in the form of an anode.

The first electrode 66 and the second electrode 68 can also define a corresponding first geometric profile 67 and second geometric profile 69. In the example shown, the first geometric profile 67 and the second geometric profile 69 are illustrated schematically with a rectangular geometric profile. It will be understood that the first electrode 66 and the second electrode 68 can have any suitable geometric profile including rectangular, planar, triangular, pointed, rounded, conical, cylindrical, thin/wire-shaped, irregular, or asymmetric, in non-limiting examples. A physical characteristic 65 of the pair of spaced electrodes 64 can be at least partially defined by the first geometric profile 67, the second geometric profile 69, the spacing distance 70, or any combination thereof.

A controller 72 and a power supply 74 are electrically coupled to the pair of spaced electrodes 64, as shown by dashed lines 76. It will be understood that the dashed lines 76 can represent a wired or wireless connection between coupled components. In the example shown, the controller 72 and power supply 74 are illustrated as distinct components wherein the power supply 74 is electrically coupled to the controller 72, and the controller 72 electrically couples the power supply 74 to the first electrode 66 and to the second electrode 68. It is also contemplated that the power supply 74 can be electrically coupled to the first electrode 66 and the second electrode 68 independently of the controller 72. It is contemplated that either or both of the controller 72 and power supply 74 can be located remotely from the housing 62 of the fluid mover 60, such as being integrated into a FADEC or other electronic system of the aircraft 10. In another example, the controller 72 and the power supply 74 can be included as distinct components within the housing 62 of the fluid mover 60.

The controller 72 can include a processor and a memory. Optionally, the controller 72 can also include a controller power supply. In such a case, the controller power supply can be utilized in place of the power supply 74 or in combination with the power supply 74.

At least one environment sensor can be provided with the fluid mover 60. In the example of FIG. 3, the at least one environment sensor includes multiple environment sensors including a first environment sensor 81 and a second environment sensor 82, although this need not be the case. The first environment sensor 81 and the second environment sensor 82 can each be configured to sense or detect an environmental parameter including, but not limited to, air pressure, air temperature, humidity, altitude, vibration level, light level, or noise level, as well as to provide an output signal indicative of the environmental parameter. The first environment sensor 81 and the second environment sensor 82 can be electrically coupled to the controller 72, such as via the lines 76. Any number of environment sensors can be provided, including only one environment sensor. For example, the first environment sensor 81 can be the sole environment sensor in the fluid mover 60, including being located within the housing 62.

The first environment sensor 81 is illustrated, by way of non-limiting example, as being located within the housing 62 proximate to the first and second electrodes 66, 68, and the second environment sensor 82 is illustrated as being located external to the housing 62. In one example, the second environment sensor 82 can be located within the aircraft 10 to sense an environmental parameter outside of the housing 62 but near the fluid mover 60. In another example, the second environment sensor 82 can be located on an external surface of the aircraft 10 to sense an environmental parameter such as atmospheric pressure during flight. In yet another example, the second environment sensor 82 can be integrated with an environmental system of the aircraft 10 and provide signals to the controller 72. It is further contemplated that either or both of the first environment sensor 81 and the second environment sensor 82 can be located in a pressurized environment or unpressurized environment. For example, the entire housing 62 of the fluid mover 60 can be located in a pressurized or unpressurized environment.

At least one actuator can be provided in the fluid mover 60 and configured to exert a force on the pair of spaced electrodes 64. In the example of FIG. 3 the at least one actuator includes a first actuator 91 physically coupled to the first electrode 66, as well as a second actuator 92 physically coupled to the second electrode 68. The first actuator 91 and the second actuator 92 are schematically illustrated with triangles, and it will be understood that any suitable actuators having any shape or form can be utilized. In non-limiting examples, the first actuator 91 and second actuator 92 can be in the form of a mechanical actuator, an electrical actuator, a hydraulic actuator, or a magnetic actuator. It will be understood that the first actuator 91 and the second actuator 92 can be utilized to apply a force on a component, such as a linear or pushing force, to cause motion of that component as is generally known in the art.

The first and second actuators 91, 92 can be electrically coupled to the controller 72 via lines 76 as shown. In operation, the controller 72 can controllably operate the pair of spaced electrodes 64 by controlling the first and second actuators 91, 92 to exert a force on the respective first and second electrodes 66, 68, thereby varying or modifying the spacing distance 70 between the pair of spaced electrodes 64. It will be understood that the spacing distance 70 can be increased or decreased by the first actuator 91 or the second actuator 92. Additionally or alternatively, either or both of the first actuator 91 and second actuator 92 can be utilized to alter a geometric profile or shape of the corresponding first and second electrodes 66, 68. In one non-limiting example, the first electrode 66 can be in the form of a bendable strip, and the first actuator 91 can exert a force on one portion of the first electrode 66 to modify the shape of the first electrode 66.

In operation, the power supply 74 can be configured to supply power to the pair of spaced electrodes 64. The controller 72 can controllably operate the power supply 74 to generate or form an operating voltage across the pair of spaced electrodes 64. Either or both of the first electrode 66 and the second electrode 68 can ionize fluid molecules, such as air molecules, in its immediate vicinity under application of the operating voltage. In the example shown, newly-ionized fluid molecules from the cathodic first electrode 66 are accelerated by the electric field and collide with neutral, non-ionized fluid molecules, causing them to also move in the same direction to form a cooling flow 95 between the pair of spaced electrodes 64. In air, the phenomenon of ionized and non-ionized air molecules moving between charged electrodes is generally known in the art as ionic wind.

The cooling flow 95 can be utilized for cooling purposes, such as for cooling the heat-generating electronic component 52 (FIG. 2). In the example of FIG. 3, the cooling flow 95 is illustrated in a direction from the first electrode 66 toward the second electrode 68. It will be understood that the cooling flow 95 can be generated in any suitable direction within the fluid mover 60. Heat generated by the electronic component 52 (FIG. 2) can be transferred to the cooling flow 95, such as via convection in one example, and out of the chassis 20, such as via the chassis frame 28 or the fins 40.

The controller 72 can be configured to determine an operating voltage across the pair of spaced electrodes 64 based on the at least one environmental parameter as indicated by the output of at least one environment sensor. It can be appreciated that as the operating voltage is increased, the cooling flow 95 can be increased within the fluid mover 60. It will be understood that "increasing" the cooling flow 95 can include accelerating the cooling flow 95 to higher speeds, or generating additional ions to increase a volumetric flow rate of the cooling flow 95.

The controller 72 can also be configured to determine a breakdown voltage within the fluid mover 60. As used herein, "breakdown voltage" will refer to an applied voltage at which an electric insulator becomes conductive. For example, air or other fluid between the pair of spaced electrodes 64 forms an electrical insulator between the pair of spaced electrodes 64. Under application of the breakdown voltage, the air or other fluid becomes conductive and enables arcing or electrical discharge between the pair of spaced electrodes 64. Such a phenomenon is also known as "dielectric breakdown." The breakdown voltage can be determined in any suitable manner. In one example, the breakdown voltage can be determined through repeated experimentation, such as generating dielectric breakdown and recording the voltage in a lookup table. In another example, the breakdown voltage can be computed based on factors such as the size of the spacing distance 70, the composition of the surrounding fluid, a temperature of the surrounding fluid, a pressure of the surrounding fluid, or the like, or combinations thereof.

The controller 72 can receive a signal indicative of an environmental parameter from either or both of the first and second environment sensors 81, 82 and determine a breakdown voltage wherein arcing or electrical discharge across the pair of spaced electrodes 64 is enabled. Based on the received environmental parameter, the controller 72 can determine the breakdown voltage as described above.

The controller 72 can be further configured to determine a threshold voltage based on the at least one environmental parameter, and to compare an operating voltage to the threshold voltage. In one non-limiting example, the controller can determine a breakdown voltage of 2.5 kV across the pair of spaced electrodes 64, as well as a maximum threshold voltage of 2.1 kV representing a high limit for the operating voltage of the fluid mover 60. In such a case, the controller 72 can form an operating voltage based on the at least one environmental parameter that satisfies the maximum threshold voltage, such as 2.0 kV. In another non-limiting example, the controller 72 can determine a minimum threshold voltage to provide sufficient cooling flow 95 for cooling purposes and based on the at least one environmental parameter, such as 0.3 kV in a non-limiting example. In such a case, the controller 72 can form an operating voltage based on the at least one environmental parameter that satisfies the minimum threshold voltage, such as 0.5 kV. It is contemplated that the controller 72 can form the operating voltage, determine the threshold voltage, or determine the breakdown voltage using any suitable method including an algorithm, a computation, a lookup table, a feedback measurement, or the like, or combinations thereof.

Figure 4:
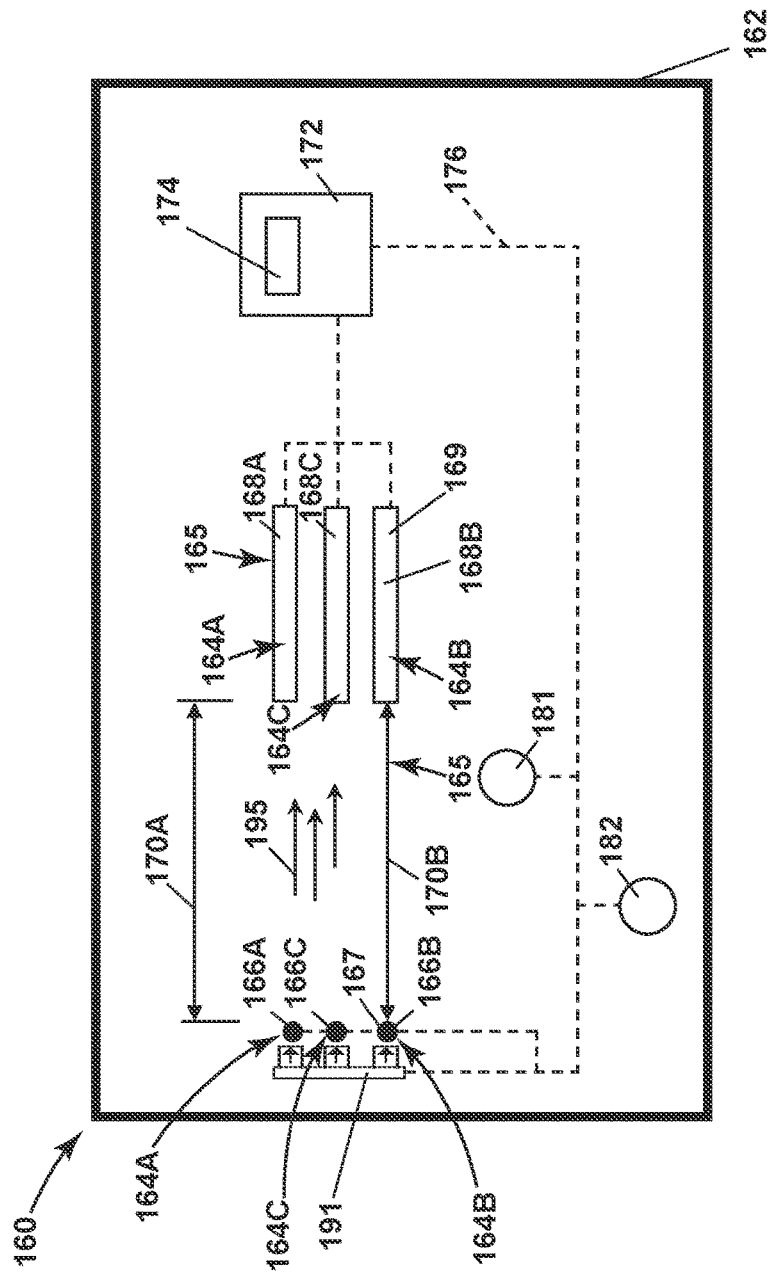
FIG. 4 is a schematic view of another fluid mover that can be utilized in the aircraft of FIG. 1 in accordance with various aspects described herein.

Referring now to FIG. 4, another fluid mover 160 is illustrated that can be utilized for cooling purposes, such as in the chassis 20. The fluid mover 160 is similar to the fluid mover 60; therefore, like parts will be identified with like numerals increased by 100, with it being understood that the description of the like parts of the fluid mover 60 applies to the fluid mover 160, except where noted.

The fluid mover 160 includes a housing 162 with at least one pair of spaced electrodes. One difference compared to the fluid mover 60 is that multiple pairs of spaced electrodes are provided. Three exemplary pairs of spaced electrodes are shown in the example of FIG. 3. A first pair of spaced electrodes 164A includes a first electrode 166A and a second electrode 168A, and a second pair of spaced electrodes 164B includes a first electrode 166B and a second electrode 168B. A third pair of spaced electrodes 164C includes a first electrode 166C and a second electrode 168C, and is positioned between the first pair of spaced electrodes 164A and second pair of spaced electrodes 164B. It will be understood that any number of electrodes can be utilized.

Another difference compared to the fluid mover 60 is that the first electrodes 166A, 166B, 166C are shown as wires extending out of the page, having a thin/cylindrical first geometric profile 167, while the second electrodes 168A, 168B, 168C are shown extending out of the page having flat, planar, or plate-like second geometric profiles 169. It is contemplated that other geometric profiles can be utilized. For example, the first geometric profile 167 can be in the form of a needle, nail, thin strip, or wire mesh. Additionally or alternatively, the second geometric profile 169 can be in the form of a cylinder or wire mesh having a thicker diameter than that of the first geometric profile 167. For example, the first geometric profile 167 can be in the form of a wire mesh having a first wire diameter, and the second geometric profile 169 can be in the form of a wire mesh having a second wire diameter greater than the first wire diameter.

A first spacing distance 170A is shown between the first pair of spaced electrodes 164A, and a second spacing distance 170B is shown between the second pair of spaced electrodes 164B. The first spacing distance 170A is illustrated as being equal to the second spacing distance 170B. It is also contemplated that the first spacing distance 170A can differ from the second spacing distance 170B. In another non-limiting example, the first spacing distance 170A and the second spacing distance 170B can differ by less than a predetermined amount such as 5%.

Another difference is that a single actuator 191 is provided in the fluid mover 160. The actuator 191 is schematically illustrated with multiple extending portions configured to exert a force on corresponding multiple electrodes, including the first electrode 166A of the first pair 164A, the first electrode 166B of the second pair 164B, and the first electrode 166C of the third pair 164C. Any number of extending portions can be utilized, including only one. The second electrodes 168A, 168B, 168C can have a fixed position, such that the single actuator 191 can exert a force on any or all of the first electrodes 166A, 166B, 166C to modify spacing distances therebetween, such as the spacing distances 170A, 170B. In this manner, some electrodes, or some pairs of spaced electrodes, can have a fixed position while other electrodes, or other pairs of spaced electrodes, can be coupled to an actuator. In still another example, multiple actuators can be provided to exert a force on every electrode within the fluid mover 160, such as to modify a spacing distance as described above.

A first environment sensor 181 and a second environment sensor 182 can also be provided in the fluid mover 160. Another difference is that both the first environment sensor 181 and the second environment sensor 182 are located within the housing 162. The first environment sensor 181 can be located proximate to the multiple pairs of spaced electrodes, such as the second pair of spaced electrodes 164B. The second environment sensor 182 can be located farther from the multiple pairs of spaced electrodes, such as near an edge of the housing 162.

A controller 172 and a power supply 174 can be electrically coupled via lines 176 to the first second, and third pairs of spaced electrodes 164A, 164B, 164C, the first and second environment sensors 181, 182, and the actuator 191. Another difference is that the controller 172 and the power supply 174 are illustrated as being integrated into a common component or module, and are also located within the housing 162 of the fluid mover 160.

During operation, the controller 172 can receive signals from either or both of the first and second environment sensors 181, 182 indicative of at least one environmental parameter, and form an operating voltage across the multiple pairs of spaced electrodes 164A, 164B, 164C based on the at least one environmental parameter. A resulting cooling flow 195 through the fluid mover 160 is illustrated in the direction shown.

For example, the controller 172 can modify a physical characteristic, such as the second spacing distance 170B, to form the operating voltage. The controller 172 can controllably operate any or all of the electrodes 166A, 166B, 166C, 168A, 168B, 168C, including controllably operating the first actuator 191 to modify the physical characteristic 165. For example, the controller 172 can controllably operate the actuator 191 to modify at least one of the spacing distances 170A, 170B. Additionally or alternatively, the controller 172 can controllably operate the power supply 174 to form the operating voltage, including modifying a supply of power from the power supply 174.

Figure 5:
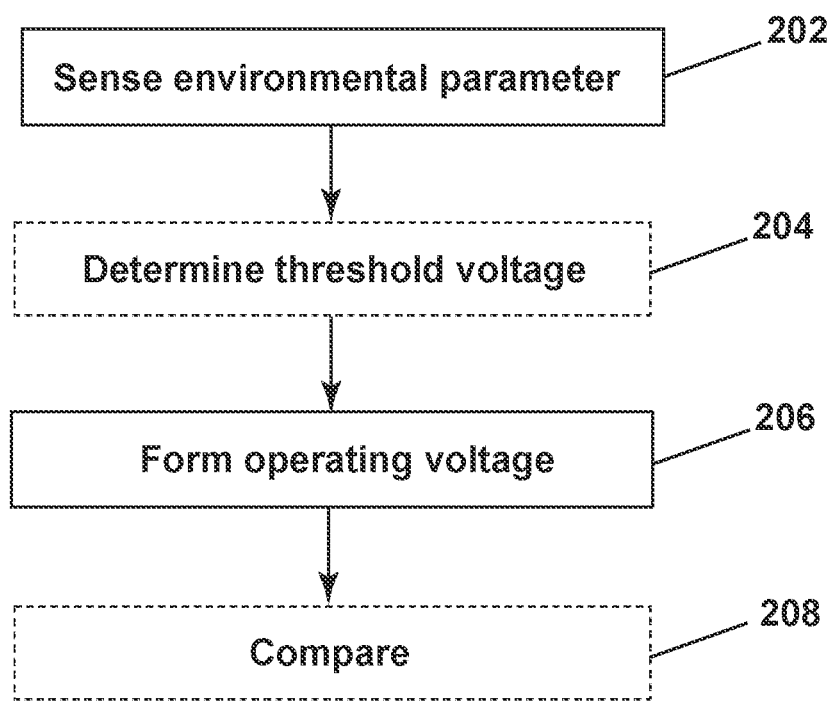
FIG. 5 is a flowchart illustrating a method of operating a fluid mover.

Referring to FIG. 5, a flowchart illustrates a method 200 of operating a fluid mover, such as the fluid mover 60, 160. At 202, the method 200 includes sensing, via a sensor such as the first environment sensor 81, 181 or the second environment sensor 82, 182, at least one environmental parameter. The environment sensor 81, 82, 181, or 182 can provide a signal indicative of the at least one environmental parameter to the controller 72, 172 including, but not limited to, an air pressure, a liquid pressure, a fluid temperature, an altitude, a humidity level, or the like.

At 204, the method 200 optionally includes determining a threshold voltage based on the at least one environmental parameter. Determining the threshold voltage can also include determining a breakdown voltage as described above wherein electrical arcing is enabled between at least one pair of spaced electrodes 64, 164A, 164B, 164C. Determining the threshold voltage can further include determining at least one of a maximum threshold voltage or a minimum threshold voltage, including determining a maximum threshold voltage based on the determined breakdown voltage.

At 206, the method 200 includes forming an operating voltage across the pair of spaced electrodes 64, 164A, 164B, 164C based on the at least one environmental parameter to move fluid between the pair of spaced electrodes 64, 164A, 164B, 164C. Forming the operating voltage can include operating or controllably operating the power supply 74, 174 conductively connected to at least one pair of spaced electrodes 64, 164A, 164B, 164C. For example, operating the power supply 74, 174 can include modifying a supply of power from the power supply 74, 174 to the at least one pair of spaced electrodes 64, 164A, 164B, 164C. Forming the operating voltage can also include controllably operating the at least one pair of spaced electrodes 64, 164A, 164B, 164C, such as modifying the physical characteristic 65, 165 of the at least one pair of spaced electrodes 64, 164A, 164B, 164C. The physical characteristic 65, 165 can include the spacing distance 70, 170A, 170B or the geometric profile 67, 69, 167, 169. For example, modifying the physical characteristic 65, 165 can include increasing the spacing distance 70, 170A, 170B, decreasing the spacing distance 70, 170A, 170B, or changing the geometric profile 67, 69, 167, 169, including via the actuators 91, 92, 191. Still further, forming the operating voltage can include forming the operating voltage to satisfy the threshold voltage as described above.

At 208, the method 200 optionally includes comparing the operating voltage to the threshold voltage. For example, the controller 72, 172 can perform a comparison of the operating voltage and the threshold voltage and determine if the operating voltage satisfies the threshold voltage. The threshold voltage can represent a minimum threshold voltage or a maximum threshold voltage as described above.

In one example of operation, the fluid mover can be in the form of an EHD air mover located within an unpressurized equipment bay in an aircraft and utilized to cool electronic components contained therein. The EHD air mover can include multiple pairs of spaced electrodes in the form of multiple first electrodes having a wire-shaped geometric profile and multiple second electrodes having a plate-shaped geometric profile. By way of example, at 202, the controller can repeatedly receive signals from an environment sensor located within the housing of the EHD air mover and indicating a local air pressure within the EHD air mover. The controller can repeatedly determine a breakdown voltage within the EHD air mover based on the signals, repeatedly form a maximum threshold voltage at 204 less than the breakdown voltage, and repeatedly form an operating voltage at 206 that satisfies the maximum threshold voltage. In the event that the operating voltage does not satisfy the maximum threshold at 208—for example, if the air pressure rapidly changes within the EHD air mover—the controller can controllably operate actuators to increase the spacing distance between at least one pair of spaced electrodes to reduce the operating voltage and to satisfy the maximum threshold voltage. Additionally or alternatively, the controller can controllably operate the power supply to reduce a supply of power to the multiple pairs of spaced electrodes in order to reduce the operating voltage.

Figure 6:
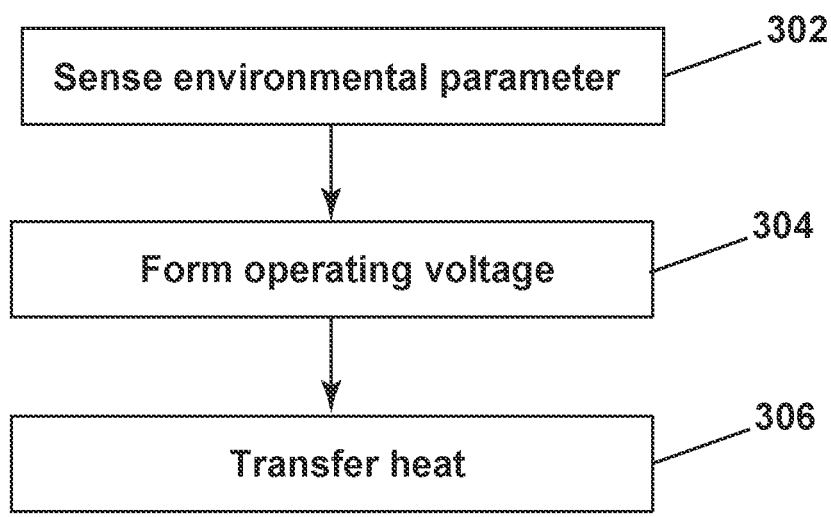
FIG. 6 is a flowchart illustrating a method of cooling a heat-generating component.

Turning to FIG. 6, a flowchart illustrates a method 300 of cooling a heat-generating component, such as the heat-producing electronic component 52.

At 302, the method 300 includes sensing, via a sensor such as the first environment sensor 81, 181 or second environment sensor 82, 182, at least one environmental parameter proximate to a pair of spaced electrodes within the fluid mover 60, 160. The environment sensor 81, 82, 181, 182 can provide a signal indicative of the at least one environmental parameter to the controller 72, 172.

At 304, the method 300 includes forming an operating voltage across the pair of spaced electrodes 64, 164A, 164B, 164C based on the at least one environmental parameter to cause a cooling flow between the pair of spaced electrodes, such as the cooling flow 95, 195. Forming the operating voltage can include operating or controllably operating the power supply 74, 174 conductively connected to at least one pair of spaced electrodes 64, 164A, 164B, 164C. For example, operating the power supply 74, 174 can include modifying a supply of power from the power supply 74, 174 to the at least one pair of spaced electrodes 64, 164A, 164B, 164C. Forming the operating voltage can also include controllably operating the at least one pair of spaced electrodes 64, 164A, 164B, 164C such as modifying the physical characteristic 65, 165 of the at least one pair of spaced electrodes 64, 164A, 164B, 164C as described above. Still further, forming the operating voltage can include forming the operating voltage to satisfy the threshold voltage as described above.

At 306, the method 300 includes transferring heat from the heat-generating component to the cooling flow. In one example, heat can be transferred via portions of the chassis 20, such as conductively transferring heat from the electronic component 52 via the chassis frame 28 to the housing 62, 162 and then to the cooling flow 95, 195 via convention or radiation. In another example, heat can be transferred directly from the heat-generating component to the cooling flow, such as by locating the heat-generating component within the housing 62, 162 and between the pair of spaced electrodes 64, 164A, 164B, 164C. The cooling flow 95, 195 can also be circulated or directed to other elements for heat transfer or dissipation of heat, such as to the fins 40, or circulated within a coolant loop, in non-limiting examples.

Some operation examples of the fluid mover of the present disclosure will be described below in accordance with various aspects described herein. It will be understood that such examples are intended to be illustrative, and do not limit the disclosure in any way.

In one example of operation, the fluid mover can be in the form of an air mover located within a pressurized cabin of the aircraft with first and second environment sensors located within the housing, a third environment sensor located on an exterior surface of the housing, and a fourth environment sensor located on an exterior surface of the aircraft. The first, second, and third environment sensors can communicate with the controller via a wired connection, and the fourth environment sensor can communicate with the controller via a wireless connection. The controller can receive signals representing air temperature, air pressure, and humidity from the respective first, second, and third environment sensors, as well as a signal representing atmospheric/ambient air pressure from the fourth environment sensor. The controller can determine a breakdown voltage and a threshold voltage based on the signals from the first, second, third, and fourth environment sensors, and can form an operating voltage based on these signals.

In another example, the fluid mover can be submerged in a liquid environment and utilized to cool a heat-generating component thermally coupled to the liquid. In such a case, at least one environment sensor can sense liquid temperature or liquid pressure in the region of the spaced electrodes, and the controller can form an operating voltage based on the sensed temperature or pressure to generate a liquid flow between the spaced electrodes. The liquid flow can be circulated to transfer heat away from the heat-generating component.

Aspects of the disclosure provide for a variety of benefits including an improved provision of voltage for the fluid mover to create a high cooling flow while preventing arcing during operation. For example, measuring the ambient pressure around the fluid mover and mapping the ambient pressure to the breakdown voltage can provide for tuning the applied or operating voltage based on altitude, such as during a flight phase e.g. takeoff or landing. Another benefit is that the fluid mover described herein can provide for optimized cooling performance under time-varying conditions that may change significantly during operation. For example, the altitude (and therefore the ambient pressure) may change significantly during a flight phase, and the fluid mover can be configured to track the changing pressure conditions and form an appropriate operating voltage to prevent dielectric breakdown while still providing fluid flow for cooling purposes. Another benefit includes the ability to drive the fluid mover at a voltage that creates the needed airflow without causing arcing issues.

Many other possible configurations in addition to those shown in the above figures are contemplated by the present disclosure. To the extent not already described, the different features and structures of the various aspects can be used in combination with others as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

Further aspects of the invention are provided by the subject matter of the following clauses:

A fluid mover, comprising a pair of spaced electrodes, a power supply electrically coupled to the pair of spaced electrodes, at least one environment sensor configured to output a signal indicative of an environmental parameter, and a controller electrically coupled to the at least one environment sensor, the power supply, and the pair of spaced electrodes, with the controller configured to: determine an operating parameter of the fluid mover based on the signal indicative of the environmental parameter, and controllably operate at least one of the power supply or at least one electrode in the pair of spaced electrodes based on the operating parameter.

The fluid mover of any preceding clause wherein the operating parameter comprises an operating voltage across the pair of spaced electrodes and the controller controllably operates the power supply to form the operating voltage.

The fluid mover of any preceding clause wherein the operating parameter comprises an operating voltage across the pair of spaced electrodes, and wherein the controller being configured to controllably operate the pair of spaced electrodes includes modifying a physical characteristic of the pair of spaced electrodes to form the operating voltage.

The fluid mover of any preceding clause wherein the modifying the physical characteristic comprises modifying a spacing distance defined between the pair of spaced electrodes.

The fluid mover of any preceding clause, further comprising an actuator electrically coupled to the controller and the pair of spaced electrodes and configured to exert a force on the at least one electrode to modify the spacing distance.

The fluid mover of any preceding clause wherein the controller is configured to controllably operate the power supply and to modify a spacing distance between the pair of spaced electrodes based on the operating parameter.

The fluid mover of any preceding clause wherein the at least one environment sensor comprises an air pressure sensor for determining one of an air pressure within the fluid mover or an air pressure external to the fluid mover.

The fluid mover of any preceding clause, further comprising a housing and wherein the at least one environment sensor is located within the housing.

The fluid mover any preceding clause wherein the at least one environment sensor comprises a first environment sensor located within the housing and a second environment sensor located external to the housing.

A method of operating a fluid mover, the method comprising sensing, via at least one environment sensor, at least one environmental parameter, and forming an operating voltage across a pair of spaced electrodes based on the at least one environmental parameter to cause a fluid flow between the pair of spaced electrodes.

The method of any preceding clause wherein the forming the operating voltage further comprises operating a power supply conductively connected to the pair of spaced electrodes.

The method of any preceding clause wherein operating the power supply further comprises modifying a supply of power to the pair of spaced electrodes.

The method of any preceding clause, further comprising modifying a physical characteristic of the pair of spaced electrodes.

The method of any preceding clause wherein the at least one environmental parameter comprises at least one of a fluid pressure, a fluid temperature, an altitude, or a humidity level.

The method of any preceding clause, further comprising determining a breakdown voltage based on the at least one environmental parameter wherein electrical arcing is enabled between the pair of spaced electrodes.

The method of any preceding clause, further comprising determining a threshold voltage based on the breakdown voltage.

The method of any preceding clause wherein forming the operating voltage includes forming the operating voltage to satisfy the threshold voltage.

The method of any preceding clause, further comprising repeatedly sensing the at least one environmental parameter and repeatedly forming the operating voltage.

The method of any preceding clause, further comprising comparing a present operating voltage to a previous operating voltage and determining an updated operating voltage based on the comparing.

The method of any preceding clause wherein the sensing further comprising sensing the at least one environment parameter via a sensor located within a housing of the fluid mover.

A method of cooling a heat-producing component, the method comprising: sensing at least one environmental parameter, forming an operating voltage across a pair of spaced electrodes based on the at least one environmental parameter to cause a cooling flow between the pair of spaced electrodes, and transferring heat from the heat-generating component to the cooling flow.

This written description uses examples to disclose aspects of the invention, including the best mode, and also to enable any person skilled in the art to practice aspects of the invention, including making and using any devices or systems and performing any incorporated methods. The patentable scope of the invention is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A fluid mover, comprising:
   a pair of spaced electrodes;
   a power supply electrically coupled to the pair of spaced electrodes;
   at least one environment sensor configured to output a signal indicative of an environmental parameter; and
   a controller electrically coupled to the at least one environment sensor, the power supply, and the pair of spaced electrodes, with the controller configured to:
      determine a breakdown voltage based on the environmental parameter wherein electrical arcing is enabled between the pair of spaced electrodes;
      determine an operating parameter of the fluid mover based on the breakdown voltage; and
      controllably operate at least one of the power supply or at least one electrode in the pair of spaced electrodes based on the operating parameter.

2. The fluid mover of claim 1 wherein the operating parameter comprises an operating voltage across the pair of spaced electrodes and the controller controllably operates the power supply to form the operating voltage.

3. The fluid mover of claim 1 wherein the operating parameter comprises an operating voltage across the pair of spaced electrodes, and wherein the controller being configured to controllably operate the pair of spaced electrodes includes modifying a physical characteristic of the pair of spaced electrodes to form the operating voltage.

4. The fluid mover of claim 3 wherein the modifying the physical characteristic comprises modifying a spacing distance defined between the pair of spaced electrodes.

5. The fluid mover of claim 4, further comprising an actuator electrically coupled to the controller and the pair of spaced electrodes and configured to exert a force on the at least one electrode to modify the spacing distance.

6. The fluid mover of claim 1 wherein the controller is configured to controllably operate the power supply and to modify a spacing distance between the pair of spaced electrodes based on the operating parameter.

7. The fluid mover of claim 1 wherein the at least one environment sensor comprises an air pressure sensor for determining one of an air pressure within the fluid mover or an air pressure external to the fluid mover.

8. The fluid mover of claim 1, further comprising a housing and wherein the at least one environment sensor is located within the housing.

9. The fluid mover of claim 8 wherein the at least one environment sensor comprises a first environment sensor located within the housing and a second environment sensor located external to the housing.

10. A method of operating a fluid mover, the method comprising:
    sensing, via at least one environment sensor, at least one environmental parameter;
    modifying a physical characteristic of a pair of spaced electrodes in the fluid mover; and
    forming an operating voltage across the pair of spaced electrodes based on the at least one environmental parameter to cause a fluid flow between the pair of spaced electrodes.

11. The method of claim 10 wherein the forming the operating voltage further comprises operating a power supply conductively connected to the pair of spaced electrodes.

12. The method of claim 11 wherein operating the power supply further comprises modifying a supply of power to the pair of spaced electrodes.

13. The method of claim 10, further comprising determining a breakdown voltage based on the at least one environmental parameter wherein electrical arcing is enabled between the pair of spaced electrodes.

14. The method of claim 10, further comprising repeatedly sensing the at least one environmental parameter and repeatedly forming the operating voltage.

15. The method of claim 14, further comprising comparing a present operating voltage to a previous operating voltage and determining an updated operating voltage based on the comparing.

16. The method of claim 10, wherein the sensing further comprising sensing the at least one environment parameter via a sensor located within a housing of the fluid mover.

17. A fluid mover, comprising:
    a pair of spaced electrodes;
    a power supply electrically coupled to the pair of spaced electrodes;
    at least one environment sensor configured to output a signal indicative of an environmental parameter proximate to the pair of spaced electrodes, the environmental parameter corresponding to altitude, humidity level, or fluid pressure; and
    a controller electrically coupled to the at least one environment sensor, the power supply, and the pair of spaced electrodes, with the controller configured to:
       determine an operating parameter of the fluid mover based on the signal indicative of the environmental parameter; and
       controllably operate at least one of the power supply or at least one electrode in the pair of spaced electrodes based on the operating parameter.

18. The fluid mover of claim 17, further comprising a housing defining an interior, wherein the pair of spaced electrodes and the at least one environment sensor are located within the interior.

19. The fluid mover of claim 17, wherein the environmental parameter corresponds to fluid pressure proximate to the pair of spaced electrodes.

20. The fluid mover of claim 19, wherein the controller is configured to controllably operate the power supply based on the fluid pressure.

* * * * *